United States Patent [19]

Mansfield et al.

[11] Patent Number: 4,873,503
[45] Date of Patent: Oct. 10, 1989

[54] ELECTRICAL COILS

[75] Inventors: Peter Mansfield; Barry L. W. Chapman, both of Beeston, England

[73] Assignee: National Research Development Corporation, London, England

[21] Appl. No.: 65,853

[22] Filed: Jun. 24, 1987

[51] Int. Cl.$^4$ .............................................. H01F 7/22
[52] U.S. Cl. .................................... 335/216; 335/299; 324/318
[58] Field of Search ................ 335/299, 216; 324/318, 324/319, 320, 321

[56] References Cited

U.S. PATENT DOCUMENTS 4,724,388  2/1988  Sano et al. .................... 324/318 X Primary Examiner—George Harris
Attorney, Agent, or Firm—Cushman, Darby & Cushman

[57] ABSTRACT

A magnetic field of required strength is provided in a desired space by a set of electrical conductors supplied with an electrical current or currents the current distribution being determined by the induced surface current distribution in a conductive former shaped to be of the same shape as the set of conductors. This enables magnetic coils of complex design to be readily designed.

8 Claims, 1 Drawing Sheet

ELECTRICAL COILS

This invention relates to electrical coils for generating magnetic fields. It has application inter alia in coils which are designed for use in NMR spectroscopic and imaging apparatus. In such apparatus a variety of coils are required, for example magnetic gradient field coils, RF coils and solenoidal type magnets generally.

According to the invention an electrical coil for generating a magnetic field comprises a set of electrical conductors and means for supplying the conductors of the set with electrical currents of magnitude such that the resultant current distribution in the set of conductors approximates to the induced surface current distribution in a conductive former positioned in the place of said set and in the presence of the required magnetic field.

In a first embodiment the conductive former comprises a highly conductive surface and the required magnetic field is time dependent. In a second embodiment the conductive former comprises a superconductive surface and the required magnetic field is static.

The present invention also provides a method of determining an induced surface current distribution in a conductive former by constructing a former of the desired shape, moving a search probe over the surface of the former in the presence of a required magnetic field and measuring at selected points a signal induced in the probe which is proportional to said induced surface current.

In a preferred embodiment the former of the desired shape is a scale model of the magnetic coil to be manufactured.

In order that the invention may be more fully understood reference will now be made to the accompanying drawing in which.

Figure 1:
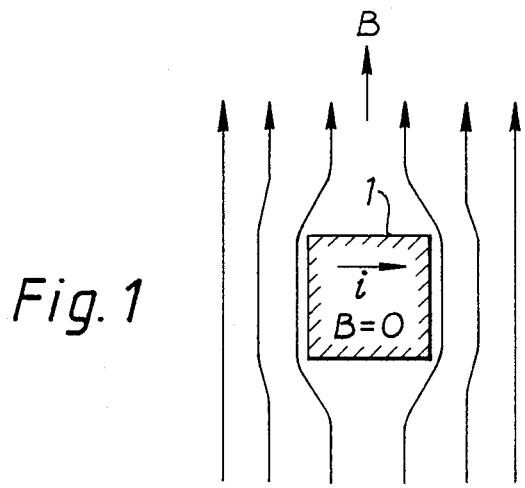
FIG. 1 illustrates diagrammatically a super-conductive screen in a magnetic field.
Figure 2:
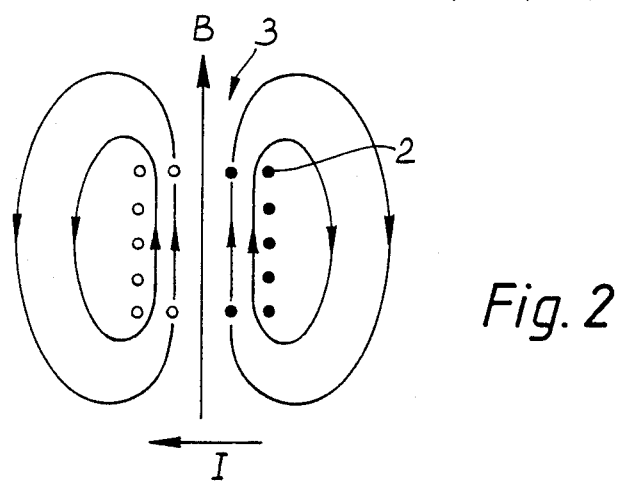
FIG. 2 illustrates an electrical coil embodying the invention.

Referring now to FIG. 1 there is shown therein a superconductive former 1 of cylindrical shape which is placed in a magnetic field B. Electrical currents i are generated on the surface of the former which ideally if the former is completely closed cause it to act as a perfect magnetic screen and reduce the magnetic field in the volume enclosed by the former to zero. FIG. 2 shows a set of electrical conductors 2 forming a coil 3 embracing a volume corresponding to the volume enclosed by former 1 and these conductors are supplied with electrical currents I of magnitude such that the resultant current distribution approximates to the distribution of current flow in the surface of former 1. The coil 3 thus mimics the induced surface currents of former 1 and will therefore produce a magnetic field within the embraced volume corresponding to the magnetic field that would have been present had the superconductive former of FIG. 1 not been there.

By Lenz's law, the direction of the field produced by the induced surface currents opposes the external field B. However, in the driven coil 3 all currents are reversed so that the central field B is in the same sense as the original field. This is equivalent to Babinet's principle in optics. Of course perfect magnetic screening occurs only with a closed superconductive surface such as a sphere, a box, a closed cylinder or the like but a set of current carrying conductors can produce a reasonable approximation to the currents induced on such a surface. The principles of induced surface current distribution may be applied when the required field is uniform or is a gradient field of chosen form. The coil may have any desired shape and in such a case the induced surface currents of a correspondingly shaped former may be mapped experimentally in an alternating field.

To design a coil in accordance with FIG. 2 the following empirical method can be used which is based upon the fact that normal conductors at room temperature of sufficient thickness, t, exclude RF fields from their interior in exactly the same way as superconductors exclude all fields. This is because electromagnetic fields are attenuated approximately as $e^{-x/d}$, where x is the penetration depth and d, the skin depth, is given by $$d = 1/(\tfrac{1}{2}\mu_0\, \sigma w)^{\tfrac{1}{2}}$$

where $\sigma$ is the conductivity and $\sigma$ is the angular frequency.

For superconductors $\sigma$ is infinite which gives perfect attenuation even at zero frequency. For high frequencies, good conductors at room temperature also provide screening if t/d is sufficiently large. For example at a frequency of 100 MHz more than 90% of the current in a copper conductor is confined to a depth of $1.5 \times 10^{-5}$m. For all practical purposes therefore a thin conducting surface in an RF field approximates to a superconductor in a field of similar magnitude at any frequency.

Surface currents in a superconducting closed surface can therefore be approximated very closely by measuring those induced in a scale model of high conductivity sheet placed in an RF field of the desired form. The apparent tautology of this method, namely that of needing an ideal field within which to perform the measurements, is overcome by having a small model in the central position of a large OF coil structure designed along conventional lines, for which the RF field generated by the coil has the desired spatial characteristics over the volume of the model. The induced surface currents are then mapped by running a search coil over the surface.

Figure 3:
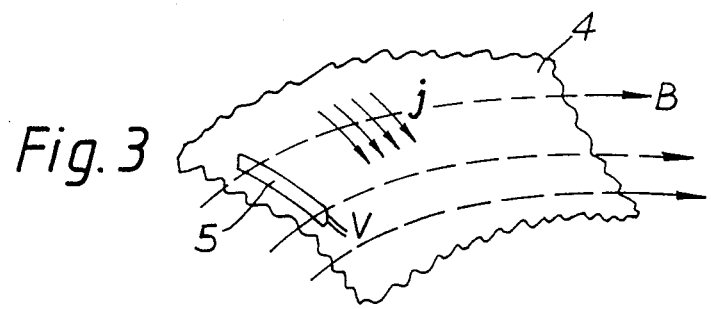
FIG. 3 is a sketch of part of a sheet shaped to conform to the required shape of a coil.

An example of this is shown in FIG. 3, which shows in sketch form a part of a copper sheet 4 which is shaped to model the desired shape of a magnet coil. Optionally the model can be scaled down in size. Sheet 4 is part of a larger closed former when it is placed in an RF field B (shown dotted) of field distribution corresponding to the distribution of the required magnetic field to be generated by the coil being designed. The presence of the RF field will generate circulating currents of density j in the surface of sheet 4. A search coil 5 is positioned close to the outer surface of sheet 4 and a voltage V will be induced therein proportional to the current density j at the position of the search coil. This voltage V is measured and recorded for different positions of oil 5. By this means the required current density distribution of the coil being designed is determined.

A similar method can be used on a superconducting model in the presence of a static magnetic field. In this case a DC flux meter of high sensitivity is used to map the surface fields.

Electrical coils constructed in accordance with the above design principles have a number of applications. Thus it is possible to design a coil of non-standard or unusual shape to produce a uniform field. For example tight fitting coils for the arm, elbow or head may be constructed which produce fields of desired form within. Such coils would resemble mediaeval body armour. Complete body coils would resemble the Tutankhamun sarcophagus and would be split for access. Saddle type coils for generating transverse gradient fields may also be designed as well as distributed Maxwell pair type coils for gradient field generation along the axis of a main magnetic field. Yet again RF coils may be designed for uniformly distributed RF fields.

In the foregoing embodiments the desired magnetic field is assumed to be that produced inside a closed coil structure. However, the invention can equally well be used to design magnetic fields external to a coil structure. This is done by enclosing a suitable magnetic field source within a superconductive or highly conductive surface. Such an arrangement would be of use for example in designing active magnetic screens (U.K. Patent Application No. 8622277) with arbitrary closed surface shapes.

In a further embodiment the invention can be applied to the design of open coil structures for the generation of specific internal or external magnetic fields. For example short solenoids, localised rf coils for particular applications in medical imaging, e.g. knee-coils, elbow coils, head coils or general limb coils. Further applications are in the design of localised magnetic field gradient coils. In these applications the coil does not completely enclose the object. Therefore the superconductive or highly conductive former would be an open structure allowing limb or other object access. In this case it is generally necessary to accept a spatial variation of the desired magnetic field over the object which is less than the perfect field form. End effects can be mitigated, however, by increasing the current density in the corresponding coil structure by additional windings.

We claim:

1. An electrical coil for generating a magnetic field comprises a set of electrical conductors and means for supplying the conductors of the set with electrical currents of magnitude such that the resultant current distribution in the set of conductors approximates to the induced surface current distribution in a conductive former positioned in the place of said set and in the presence of the required magnetic field.

2. An electrical coil as claimed in claim 1 in which the conductive former comprises a highly conductive surface and the required magnetic field is time dependent.

3. An electrical coil as claimed in claim 1 in which the conductive former comprises a superconductive surface and the required magnetic field is static.

4. A method of determining an induced surface current distribution in a conductive former by constructing a former of the desired shape, moving a search probe over the surface of the former in the presence of a required magnetic field and measuring at selected points the signal induced in the probe proportional to said induced surface current.

5. A method of determining an induced surface current distribution as claimed in claim 4 in which the former of the desired shape is a scale model the shape of a magnetic coil to be manufactured.

6. A method for determining a first current distribution required for a coil having a predetermined shape to achieve a first desired magnetic field, comprising the steps of:

placing a conductive former in a secured magnetic field corresponding to said first magnetic field, the former having a shape corresponding to the predetermined shape of the coil, the former having a second current distribution induced on its surface;

moving a search probe over the surface of the former and inducing a probe signal therein indicative of the second current distribution;

the measured second current distribution approximately the first current distribution to be induced in said coil to cause the desired magnetic field.

7. A method as claimed in claim 6, wherein the former is a highly-conductive scale model of the electrical coil, the magnetic field being an RF field having a predetermined form.

8. A method as claimed in claim 6, wherein the former is a superconductor model, the magnetic field is static, and the search probe is a sensitive DC flux meter.

* * * * *

UNITED STATES PATENT AND TRADEMARK OFFICE
CERTIFICATE OF CORRECTION

PATENT NO. : 4,873,503

DATED : October 10, 1989

INVENTOR(S) : MANSFIELD, Peter and CHAPMAN, Barry L.W.

It is certified that error appears in the above-identified patent and that said Letters Patent is hereby corrected as shown below:

On the Title page:

[30]   Foreign Application Priority Data
   June 26, 1986 [GB]   United Kingdom..............8615674

Signed and Sealed this

Twenty-fifth Day of September, 1990

Attest:

HARRY F. MANBECK, JR.

*Attesting Officer*   *Commissioner of Patents and Trademarks*